United States Patent
Rosales

(10) Patent No.: US 6,229,714 B1
(45) Date of Patent: May 8, 2001

(54) APPARATUS AND METHOD FOR ELECTROMAGNETIC SHIELDING OF EQUIPMENT CABINETS

(75) Inventor: Rolando Rosales, Lisle, IL (US)

(73) Assignee: Lucent Technologies Inc, Murray Hill, NJ (US)

( * ) Notice: Subject to any disclaimer, the term of this patent is extended or adjusted under 35 U.S.C. 154(b) by 0 days.

(21) Appl. No.: 09/318,285

(22) Filed: May 25, 1999

(51) Int. Cl.[7] .................................................. H05K 9/00
(52) U.S. Cl. ........................ 361/818; 361/814; 361/816; 174/35 R; 174/35 GC
(58) Field of Search ................................ 361/752, 753, 361/799, 800, 801, 802, 814, 816, 818; 714/35 R, 35 GC, 35 TS, 35 MS, 50.51

(56) References Cited

U.S. PATENT DOCUMENTS

| | | | |
|---|---|---|---|
| 3,277,230 | * 10/1966 | Stickney et al. | 174/35 R |
| 5,134,547 | * 7/1992 | Takamizawa | 361/816 |
| 5,194,691 | * 3/1993 | McIlwraith | 174/35 GC |
| 5,204,496 | * 4/1993 | Boulay et al. | 174/35 GC |
| 5,402,323 | * 3/1995 | Schwenk et al. | 361/816 |

* cited by examiner

*Primary Examiner*—Jeffrey Gaffin
*Assistant Examiner*—Phuong T. Vu
(74) *Attorney, Agent, or Firm*—James W Wiegand

(57) ABSTRACT

An electrical enclosure in accordance with the principles of the invention includes one or more conductive straps connecting an enclosure door to an enclosure cabinet. The conductive strap may include a detachable connection at one, or both, ends and may be employed in combination with a conventional conductive gasket to form a substantially continuous conductive enclosure for electronics equipment. The conductive strap may include a detachable connection at one or both ends. The body of the conductive strap may be composed of solid or braided conductor material, such as a solid metal wire or braided metal wire. The strap may be employed in conjunction with a conventional conductive gasket and is connected to the gasket, the cabinet door, and the cabinet body in a manner that ensures that all three components are held at substantially the same electrical potential. A plurality of straps may be employed to insure that discontinuous conductive gaskets form, in conjunction with a cabinet door and cabinet body, a substantially continuous conductive shield around a cabinet's enclosed electronics.

20 Claims, 4 Drawing Sheets

APPARATUS AND METHOD FOR ELECTROMAGNETIC SHIELDING OF EQUIPMENT CABINETS

FIELD OF THE INVENTION

The invention relates to electromagnetic shielding and, more particularly, to electromagnetic shielding of electronic equipment cabinets.

BACKGROUND OF THE INVENTION

Electrical or electronic systems (for the sake of clarity, such systems will be referred to hereinafter as electronic systems), including computers, telephone network switching equipment, and network routers are typically housed in cabinets. The electronic equipment is generally accessible for servicing and upgrading through doors attached to the cabinet body. The electronics contained within the cabinet may emit signals that could interfere with other electronic equipment, including nearby computers and communications devices. Consequently, the level of such emissions are typically regulated by government entities and, even if the emission levels weren't regulated, their potential for adversely affecting other equipment would dictate that their levels be kept to a minimum. In order to suppress such emissions, both from escaping from such enclosures and from entering the enclosures, the basic material of the cabinets is typically a conductive material such as a metal which, in effect, forms a "Faraday Cage" around the enclosed electronics. Such electronic equipment typically includes a gasket, or seal, made of a resilient conductive material affixed to either the cabinet door or the cabinet body to provide a substantially continuous conductive surface surrounding the cabinet's electronics when the cabinet door is closed. Unfortunately, electrical contact between the door and the gasket and/or between the gasket and the cabinet is not always assured. As a result, the electronic equipment within the cabinet may be susceptible to electromagnetic emissions from other devices outside the cabinet, may disrupt electronic devices outside the cabinet, and may prevent the cabinet and electronic equipment within from meeting government emissions requirements.

An apparatus that ensures conductive contact between a cabinet door and a cabinet would therefor be highly desirable.

SUMMARY

An electrical enclosure that includes an electrically conductive cabinet and cabinet door, in accordance with the principles of the invention, includes a conductive strap that makes conductive contact between the cabinet door and cabinet.

In an illustrative embodiment, the strap may include a detachable connection at one or more ends. The body of the conductive strap may be composed of solid or braided conductor material, such as a solid metal wire or braided metal wire. The strap may be employed in conjunction with a conventional conductive gasket and is connected to the gasket, the cabinet door, and the cabinet body in a manner that ensures that all three components are held at substantially the same electrical potential.

A plurality of straps may be employed to insure that discontinuous conductive gaskets form, in conjunction with a cabinet door and cabinet body, a substantially continuous conductive shield around a cabinet's enclosed electronics.

BRIEF DESCRIPTION OF THE DRAWINGS

The above and further features, aspects, and advantages of the invention will be apparent to those skilled in the art from the following detailed description, taken together with the accompanying drawings in which.

DETAILED DESCRIPTION

An electrical enclosure in accordance with the principles of the invention includes one or more conductive straps connecting an enclosure door to an enclosure cabinet. The conductive strap may include a detachable connection at one, or both, ends and may be employed in combination with a conventional conductive gasket to form a substantially continuous conductive enclosure for electronics equipment.

Figure 1:
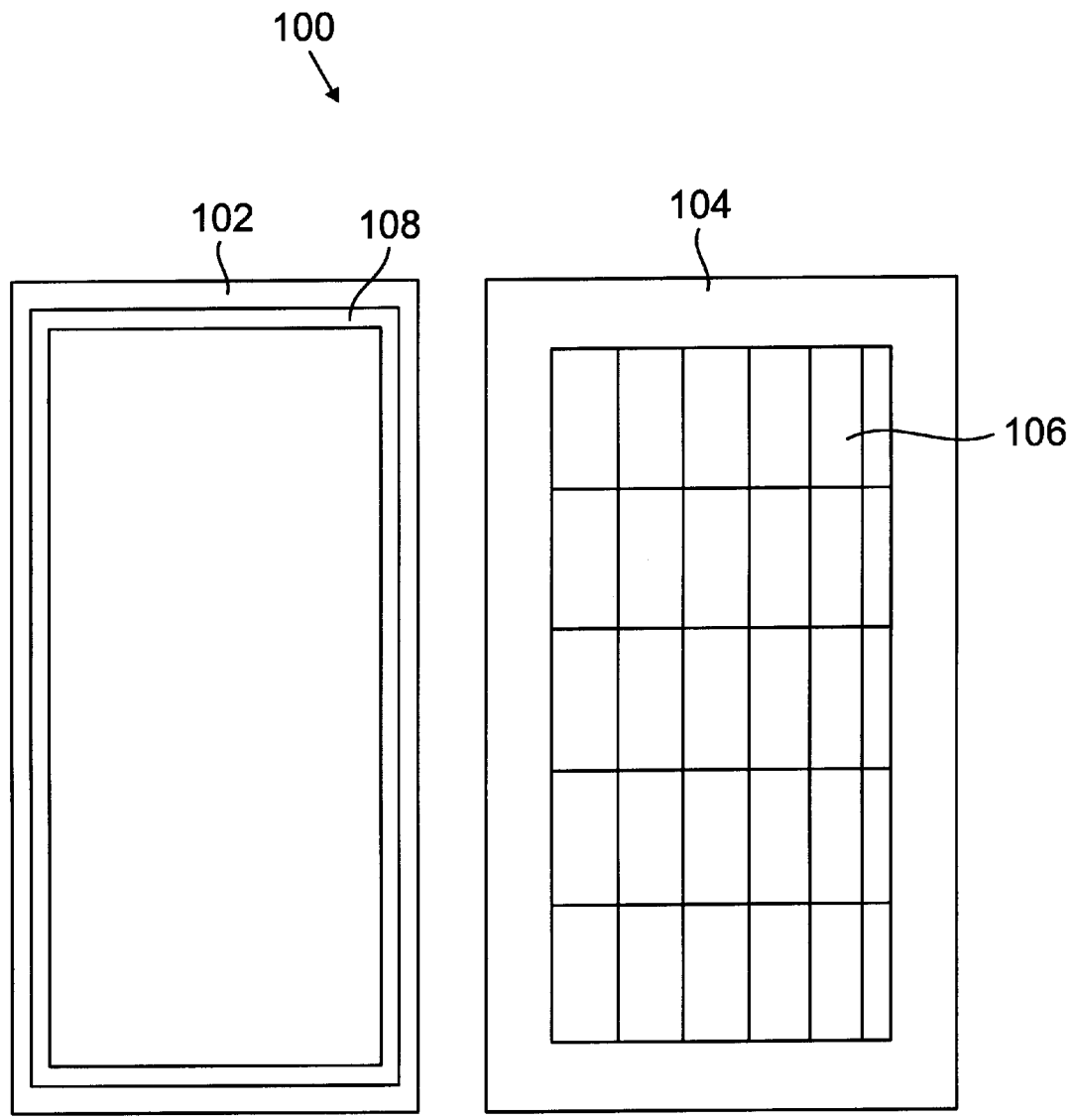
FIG. 1 is an elevation view of a conventional electronics system, including electronics, and an electrically conductive enclosure.

The elevation view of FIG. 1 illustrates a prior art electronics enclosure 100 including an electrically conductive door 102 and an electrically conductive cabinet body 104. Racks of electronics equipment 106 may emit undesirable electromagnetic waves and may also be susceptible to interference from electromagnetic waves that might make their way to the equipment 106. A conductive gasket 108, which may be composed of a plurality of elements, is attached to the door 102. Conductive gaskets 108 are known and may be obtained, for example, from Instrument Specialties, Delaware Water Gap, PA 18327. One of the objects of a conventional enclosure 100 such as depicted in FIG. 1 is to substantially continuously surround the equipment 106 with electrically conductive material. The object of such an enclosure is to thereby form what is sometimes referred to as a "Faraday Cage", which reflects and dissipates signals from either inside or outside the enclosure so that the signals remain on their respective "side" (that is, in-side or out-side of the enclosure. As will be described in the discussion related to FIG. 2, this objective is sometimes thwarted in prior art enclosures such as that of FIG. 1.

Figure 2:
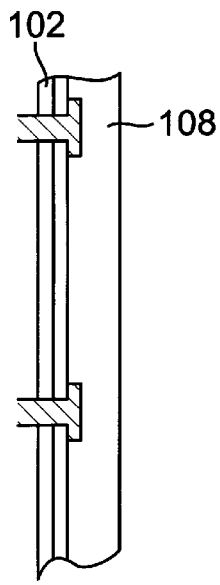
FIG. 2 is a sectional view of a conventional conductive gasket attached to an enclosure door.

As illustrated in the sectional view of FIG. 2, a prior art resilient conductive gasket 108 may be attached to a door 102 (or cabinet body 104) by fasteners 202, which may be, for example, screws made of plastic materials. Although the conductive gasket 108 is attached to the conductive door 102 (body 104), the conductive gasket 108 may not make good electrical contact with the door 102 (body 104). Although the cabinet design may call for the surface to which the gasket is attached to be "bare", or unpainted, so that good electrical contact may be established between the attachment surface and the gasket 108, during the manufacturing process the attachment surface may nevertheless be coated. As a result, the contact between the gasket 108 and surface to which it is attached, whether on the door 102 or the body 104 of the cabinet, may be insufficient to provide a conductive seal when the door 102 is closed.

Figure 3:
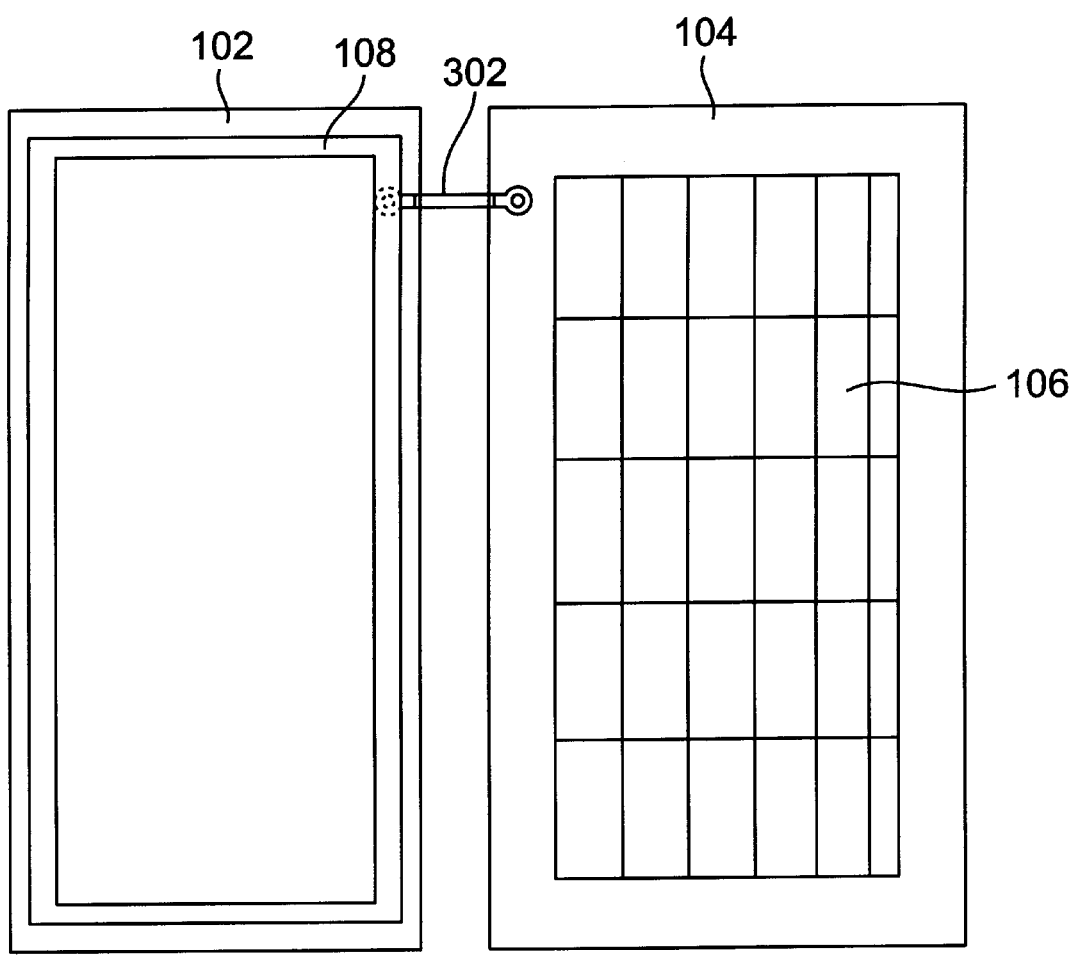
FIG. 3 illustrates the use of a conductive strap in establishing a substantially continuous electrically conductive electronics enclosure.

In accordance with the principles of the invention, as illustrated in the elevation view of FIG. 3, a conductive strap 302 is connected at one end to the cabinet door 102 and at the other end to the cabinet body 104. One or both ends of the conductive strap may be detachably connected to the door 102 and/or the cabinet body 104 through the use of a detachable connector. One such connector is commonly referred to as a "banana style connector", for example. A plurality of such connectors may be attached between the door 102 and the cabinet body 104, with one connector for each of a plurality of disjoint gasket sections, for example.

Figure 4A:
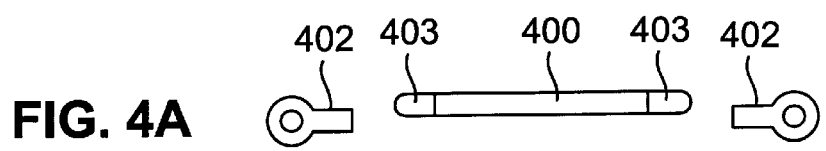
FIGS. 4A and 4B are, respectively elevation views illustrating an exploded view of a conductive strap and an optional piercing feature of the strap's conductive annular attachment.
Figure 4B:
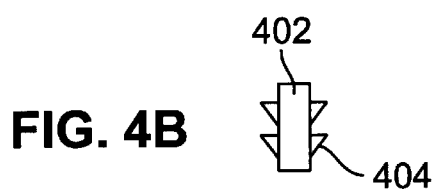

The exploded view of FIG. 4A illustrates the components parts of an illustrative embodiment of a conductive strap, which may be employed in accordance with the principles of the invention to form a substantially continuous electrically conductive enclosure by electrically connecting a cabinet door, a conductive gasket, and a conductive cabinet. The strap 302 may be formed of a conductive material such as a single strand, multi-strand, or braided wire, 400 for example. The wire 400 may be directly connected on either one or both ends, by crimping, for example, to an "electrically conductive annular attachment" 402 through which a screw or bolt may be extended to attach the strap 302 to the door 102 or cabinet body 104. Alternatively, one or both ends of the wire 400 may have an insertable device, such as a banana plug, attached for insertion into receiving ends of the electrically conductive annular attachment(s) 402. As illustrated in the end view of FIG. 4B, the eye 402 may have a piercing feature 404, such as upraised "spikes"or burrs, formed in one or both surfaces. The piercing feature 404 may be employed to ensure conductive connection with the door 102 or cabinet body 104 to which the eye 402 is attached, by, for example, piercing a coating of paint that has been inadvertently applied to the surface to which the eye 402 attaches.

Figure 5:
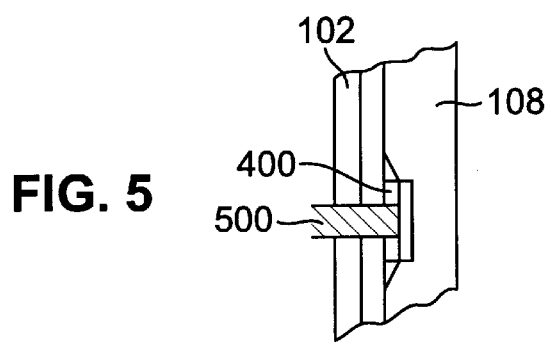
FIG. 5 is a sectional view, illustrating the attachment of the strap of FIG. 3 to a conductive gasket and to an enclosure.

The sectional view of FIG. 5 illustrates an exemplary attachment of a strap's electrically conductive annular attachment 402 to a resilient conductive gasket 108 and a door 102. In this illustrative embodiment a fastener 500, such as a metal screw or bolt, pierces, or is threaded through, the gasket 108, through the electrically conductive annular attachment 402, and, making mechanical and electrical connection, through the door 102.

Figure 6:
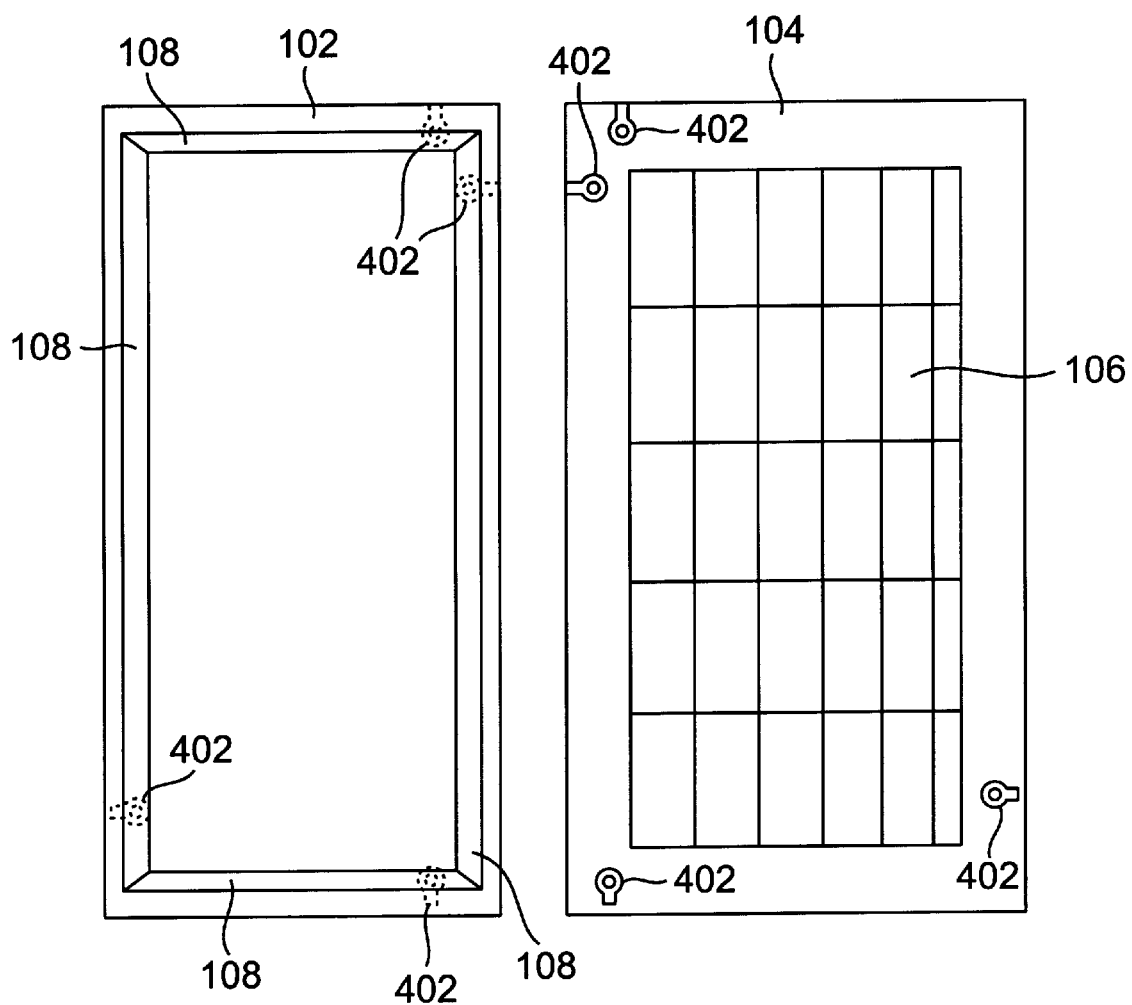
FIG. 6 is an elevation view of an enclosure having a plurality of conductive straps in accordance with the principles of the invention.

As illustrated in the elevation view of FIG. 6, a plurality of straps may be connected to the door 102 and cabinet body 104. In this illustrative embodiment a plurality of electrically conductive annular attachments 402 having receptacles for mating connection to wires having banana plugs attached at both ends are distributed around the perimeter of the door 102, and, in corresponding locations, around the perimeter of the cabinet body 104.

The foregoing description of specific embodiments of the invention has been presented for the purposes of illustration and description. It is not intended to be exhaustive or to limit the invention to the precise forms disclosed, and many modifications and variations are possible in light of the above teachings. The embodiments were chosen and described to best explain the principles of the invention and its practical application, and to thereby enable others skilled in the art to best utilize the invention. It is intended that the scope of the invention be limited only by the claims appended hereto.

What is claimed is:

1. An enclosure for shielding electromagnetic equipment comprising:
   an electrically conductive cabinet having an electrically conductive door,
   an electrically conductive gasket attached between the door and the cabinet, and
   a conductive strap mechanically fastened at a first end to the door to thereby make electrically conductive contact with the door, and mechanically fastened at a second end to the cabinet to thereby make electrical contact with the cabinet, the mechanical fastening of one of said first or second ends also making electrically conductive contact between the conductive gasket and the conductive strap.

2. The enclosure of claim 1 wherein a plurality of conductive straps are connected to make electrical connection between the door, the cabinet and the conductive gasket.

3. The enclosure of claim 1 wherein the gasket comprises a plurality of disjoint conductive gaskets positioned around the perimeter of the door, and the enclosure includes a plurality of corresponding separate conductive straps mechanically fastened at a first end to the door to thereby make electrically conductive contact with the door, and mechanically fastened at a second end to the cabinet to thereby make electrical contact with the cabinet, the mechanical fastening of one of said first or second ends of each strap also making electrically conductive contact between a corresponding disjoint conductive gasket and the conductive strap.

4. The enclosure of claim 1 wherein the conductive strap includes an elongate conductor having a connector on each of its ends.

5. The enclosure of claim 4 wherein the elongate conductor is a single strand wire.

6. The enclosure of claim 4 wherein the elongate conductor is a braided cable.

7. The enclosure of claim 4 wherein at least one of the connectors is a detachable connector.

8. The enclosure of claim 7 wherein said detachable connector is a banana plug connector.

9. The enclosure of claim 4 wherein the strap includes an annular piece for receiving an attachment device, the annular piece having a piercing feature situated to make attachment to a cabinet surface through an intervening non-conductive material.

10. The enclosure of claim 4 wherein the strap electrically connects the door, the gasket, and the cabinet body to form a substantially continuous electrically conductive enclosure.

11. Apparatus comprising:
   an enclosure for shielding electromagnetic equipment comprising:
      an electrically conductive cabinet having an electrically conductive door,
      an electrically conductive gasket attached between the door and the cabinet,
      a conductive strap mechanically fastened at a first end to the door to thereby make electrically conductive contact with the door, and mechanically fastened at a second end to the cabinet to thereby make electrical contact with the cabinet, the mechanical fastening of one of said first or second ends also making electrically conductive contact between the conductive gasket and the conductive strap, and
   electronics devices enclosed within the electrically conductive enclosure.

12. The apparatus of claim 11 wherein a plurality of conductive straps are connected to make electrical connection between the door, the cabinet and the conductive gasket.

13. The apparatus of claim 11 wherein the gasket comprises a plurality of disjoint conductive gaskets positioned around the perimeter of the door, and the enclosure includes a plurality of corresponding separate conductive straps mechanically fastened at a first end to the door to thereby make electrically conductive contact with the door, and mechanically fastened at a second end to the cabinet to thereby make electrical contact with the cabinet, the mechanical fastening of one of said first or second ends of each strap also making electrically conductive contact between a corresponding disjoint conductive gasket and the conductive strap.

14. The apparatus of claim 11 wherein the conductive strap includes an elongate conductor having a connector on each of its ends.

15. The apparatus of claim 14 wherein the elongate conductor is a single strand wire.

16. The apparatus of claim 14 wherein the elongate conductor is a braided cable.

17. The apparatus of claim 14 wherein at least one of the connectors is a detachable connector.

18. The apparatus of claim 17 wherein said detachable connector is a banana plug connector.

19. The apparatus of claim 14 wherein the strap includes an annular piece for receiving an attachment device, the annular piece having a piercing feature situated to make attachment to a cabinet surface through an intervening non-conductive material.

20. The apparatus of claim 4 wherein the strap electrically connects the door, the gasket, and the cabinet body to form a substantially continuous electrically conductive enclosure.

* * * * *